(12) United States Patent
Lapujade et al.

(10) Patent No.: US 10,986,722 B1
(45) Date of Patent: Apr. 20, 2021

(54) HIGH PERFORMANCE HEAT SINK FOR DOUBLE SIDED PRINTED CIRCUIT BOARDS

(71) Applicant: GOODRICH CORPORATION, Charlotte, NC (US)

(72) Inventors: Philippe Lapujade, Chandler, AZ (US); Anthony Bartels, Glendale, AZ (US); Andre Hessling von Heimendahl, Koblenz (DE)

(73) Assignee: GOODRICH CORPORATION, Charlotte, NC (US)

( * ) Notice: Subject to any disclaimer, the term of this patent is extended or adjusted under 35 U.S.C. 154(b) by 0 days.

(21) Appl. No.: 16/685,813

(22) Filed: Nov. 15, 2019

(51) Int. Cl.
| | |
|---|---|
| *H05K 1/02* | (2006.01) |
| *H05K 1/11* | (2006.01) |
| *F21S 43/19* | (2018.01) |
| *F21V 23/00* | (2015.01) |
| *F21S 45/47* | (2018.01) |
| *F21S 43/14* | (2018.01) |
| *B64D 47/02* | (2006.01) |
| *H05K 1/18* | (2006.01) |
| *F21Y 115/10* | (2016.01) |
| *F21W 107/30* | (2018.01) |

(52) U.S. Cl.
CPC .......... *H05K 1/0203* (2013.01); *B64D 47/02* (2013.01); *F21S 43/14* (2018.01); *F21S 43/195* (2018.01); *F21S 45/47* (2018.01); *F21V 23/003* (2013.01); *H05K 1/115* (2013.01); *H05K 1/181* (2013.01); *B64D 2203/00* (2013.01); *F21W 2107/30* (2018.01); *F21Y 2115/10* (2016.08); *H05K 2201/066* (2013.01); *H05K 2201/10106* (2013.01); *H05K 2201/10393* (2013.01); *H05K 2201/10545* (2013.01)

(58) Field of Classification Search
CPC .. H05K 1/0203; H05K 1/0204; H05K 1/0206; H05K 1/115; H05K 1/181; H05K 2201/066; H05K 2201/10106; H05K 2201/10393; H05K 2201/10545; F21S 43/14; F21S 43/195; F21S 45/47; F21V 23/003; F21V 23/004; B64D 2203/00; B64D 47/02; F21Y 2115/10; F21W 2107/30

See application file for complete search history.

(56) References Cited

U.S. PATENT DOCUMENTS

| | | | |
|---|---|---|---|
| 8,152,337 B2 | 4/2012 | Herms et al. | |
| 9,829,188 B2 | 11/2017 | Lee et al. | |
| 9,990,869 B1 | 6/2018 | Hall | |
| 2002/0131238 A1* | 9/2002 | Fisher | H01L 23/40 |
| | | | 361/719 |
| 2007/0041190 A1* | 2/2007 | Chou | F21V 19/0035 |
| | | | 362/249.16 |

(Continued)

*Primary Examiner* — Jacob R Crum
(74) *Attorney, Agent, or Firm* — Snell & Wilmer LLP

(57) ABSTRACT

A system for transferring heat from printed circuit boards (PCBs) with light emitting diodes (LEDs) includes a PCB having a first side and a second side and configured to be coupled to an exterior portion of an aircraft. The system further includes a LED located on the first side of the PCB. The system further includes a first metal strip located on the second side of the PCB. The system further includes a heat sink configured to contact the first metal strip to dissipate heat from the PCB.

17 Claims, 4 Drawing Sheets

(56) References Cited

U.S. PATENT DOCUMENTS

| | | | | |
|---|---|---|---|---|
| 2009/0116252 A1* | 5/2009 | Kille | H05K 1/0204 | 362/373 |
| 2010/0033976 A1* | 2/2010 | Sun | F21V 29/83 | 362/382 |
| 2010/0039817 A1* | 2/2010 | Wen | F21V 29/763 | 362/253 |
| 2011/0186896 A1* | 8/2011 | Loh | H01L 33/58 | 257/98 |
| 2011/0278638 A1* | 11/2011 | Lin | H05K 1/0204 | 257/99 |
| 2012/0044669 A1* | 2/2012 | Ogata | F21K 9/23 | 362/97.3 |
| 2012/0056234 A1* | 3/2012 | Lee | H01L 33/641 | 257/99 |
| 2012/0061695 A1* | 3/2012 | Kim | H01L 33/486 | 257/88 |
| 2012/0175643 A1* | 7/2012 | West | H05K 1/021 | 257/88 |
| 2013/0215613 A1* | 8/2013 | Wu | F21K 9/20 | 362/249.02 |
| 2014/0112009 A1* | 4/2014 | Yeh | B23K 20/002 | 362/382 |
| 2014/0254180 A1* | 9/2014 | Yeh | F21K 9/20 | 362/373 |
| 2015/0036362 A1* | 2/2015 | Van Gompel | F21V 29/70 | 362/382 |
| 2015/0260390 A1* | 9/2015 | Bretschneider | F21V 19/0055 | 362/294 |
| 2016/0064630 A1* | 3/2016 | Castro | H01L 33/647 | 257/99 |
| 2017/0167716 A1* | 6/2017 | Ezaki | C08K 3/04 | |
| 2017/0263546 A1* | 9/2017 | Lin | H01L 23/49811 | |
| 2018/0257542 A1* | 9/2018 | Baker | F21S 45/49 | |
| 2019/0280179 A1* | 9/2019 | Yamasaki | F21V 29/76 | |
| 2019/0289755 A1 | 9/2019 | Mammen et al. | | |

\* cited by examiner

HIGH PERFORMANCE HEAT SINK FOR DOUBLE SIDED PRINTED CIRCUIT BOARDS

FIELD

The present disclosure relates to systems for distributing heat from a printed circuit board having one or more light emitting diode.

BACKGROUND

Prolonged exposure to heat may cause certain electrical components (e.g., high power light emitting diodes (LEDs)) to degrade over time. Also, LEDs may generate more heat than other electrical components. A conventional approach to distributing heat from printed circuit boards (PCBs) that include LEDs has been to directly connect the LEDs to a conventional heat sink. However, significant heat may remain on the PCB, especially if the LEDs are high power devices. Additionally, difficulty arises if electrical components are coupled to a different surface of the PCB than the surface to which the LEDs are mounted.

SUMMARY

Disclosed herein is a system for transferring heat from printed circuit boards (PCBs) with light emitting diodes (LEDs). The system includes a PCB having a first side and a second side and configured to be coupled to an exterior portion of an aircraft. The system further includes a LED located on the first side of the PCB. The system further includes a first metal strip located on the second side of the PCB. The system further includes a heat sink configured to contact the first metal strip to dissipate heat from the PCB.

Any of the foregoing embodiments may further include a metal pad located on the first side of the PCB; and a second metal strip located on the second side of the PCB and electrically connected to the metal pad located on the first side of the PCB.

In any of the foregoing embodiments, the second metal strip is electrically connected to the metal pad via metal-filled vias, and the second metal strip is electrically isolated from the first metal strip.

In any of the foregoing embodiments, the LED has a first terminal and a second terminal; the metal pad includes a first metal pad electrically connected to the first terminal of the LED and a second metal pad electrically connected to the second terminal of the LED; and the second metal strip includes a first portion electrically connected to the first metal pad and a second portion electrically connected to the second metal pad.

Any of the foregoing embodiments may further include a metal pad located on the first side of the PCB, electrically isolated from the LED, and electrically connected to the first metal strip.

Any of the foregoing embodiments may further include an aperture extending through the PCB and the first metal strip and configured to receive a fastener to couple the PCB to the heat sink.

In any of the foregoing embodiments, the heat sink includes a corrugated heat sink separate from the PCB and having a first rib configured to contact and extend along the first metal strip to dissipate heat from the PCB.

In any of the foregoing embodiments, the heat sink includes a conductive surface mounted component configured to be mounted to the PCB.

Any of the foregoing embodiments may further include electrical components coupled to the second side of the PCB.

Also disclosed is a system for transferring heat from printed circuit boards (PCBs) with light emitting diodes (LEDs). The system includes a PCB having a first side and a second side and configured to be coupled to an exterior portion of an aircraft. The system further includes a LED located on the first side of the PCB. The system further includes a first metal strip located on the second side of the PCB. The system further includes a corrugated heat sink separate from the PCB and having a first rib configured to contact and extend along the first metal strip to dissipate heat from the PCB.

Any of the foregoing embodiments may further include a metal pad located on the first side of the PCB; and a second metal strip located on the second side of the PCB and electrically connected to the metal pad located on the first side of the PCB.

In any of the foregoing embodiments, the second metal strip is electrically connected to the metal pad via metal-filled vias, and the second metal strip is electrically isolated from the first metal strip.

In any of the foregoing embodiments, the LED has a first terminal and a second terminal; the metal pad includes a first metal pad electrically connected to the first terminal of the LED and a second metal pad electrically connected to the second terminal of the LED; and the second metal strip includes a first portion electrically connected to the first metal pad and a second portion electrically connected to the second metal pad.

Any of the foregoing embodiments may further include a metal pad located on the first side of the PCB, electrically isolated from the LED, and electrically connected to the first metal strip.

Any of the foregoing embodiments may further include an aperture extending through the PCB and the first metal strip and configured to receive a fastener to couple the PCB to the corrugated heat sink.

Also disclosed is a system for transferring heat from printed circuit boards (PCBs) with light emitting diodes (LEDs). The system includes a PCB having a first side and a second side and configured to be coupled to an exterior portion of an aircraft. The system further includes a LED located on the first side of the PCB. The system further includes a first metal strip located on the second side of the PCB. The system further includes a conductive surface mounted component configured to be mounted to the second side of the PCB, to be in contact with the first metal strip, and to dissipate heat from the PCB.

Any of the foregoing embodiments may further include a metal pad located on the first side of the PCB; and a second metal strip located on the second side of the PCB and electrically connected to the metal pad located on the first side of the PCB.

In any of the foregoing embodiments, the second metal strip is electrically connected to the metal pad via metal-filled vias, and the second metal strip is electrically isolated from the first metal strip.

In any of the foregoing embodiments, the LED has a first terminal and a second terminal; the metal pad includes a first metal pad electrically connected to the first terminal of the LED and a second metal pad electrically connected to the second terminal of the LED; and the second metal strip includes a first portion electrically connected to the first metal pad and a second portion electrically connected to the second metal pad.

Any of the foregoing embodiments may further include a metal pad located on the first side of the PCB, electrically isolated from the LED, and electrically connected to the first metal strip.

The foregoing features and elements may be combined in various combinations without exclusivity, unless expressly indicated otherwise. These features and elements as well as the operation thereof will become more apparent in light of the following description and the accompanying drawings. It should be understood, however, the following description and drawings are intended to be exemplary in nature and non-limiting.

BRIEF DESCRIPTION OF THE DRAWINGS

The subject matter of the present disclosure is particularly pointed out and distinctly claimed in the concluding portion of the specification. A more complete understanding of the present disclosure, however, may best be obtained by referring to the detailed description and claims when considered in connection with the figures, wherein like numerals denote like elements.

DETAILED DESCRIPTION

The detailed description of exemplary embodiments herein makes reference to the accompanying drawings, which show exemplary embodiments by way of illustration. While these exemplary embodiments are described in sufficient detail to enable those skilled in the art to practice the exemplary embodiments of the disclosure, it should be understood that other embodiments may be realized and that logical changes and adaptations in design and construction may be made in accordance with this disclosure and the teachings herein. Thus, the detailed description herein is presented for purposes of illustration only and not limitation. The steps recited in any of the method or process descriptions may be executed in any order and are not necessarily limited to the order presented.

Furthermore, any reference to singular includes plural embodiments, and any reference to more than one component or step may include a singular embodiment or step. Also, any reference to attached, fixed, connected or the like may include permanent, removable, temporary, partial, full and/or any other possible attachment option. Additionally, any reference to without contact (or similar phrases) may also include reduced contact or minimal contact. Surface shading lines may be used throughout the figures to denote different parts but not necessarily to denote the same or different materials.

Figure 1:
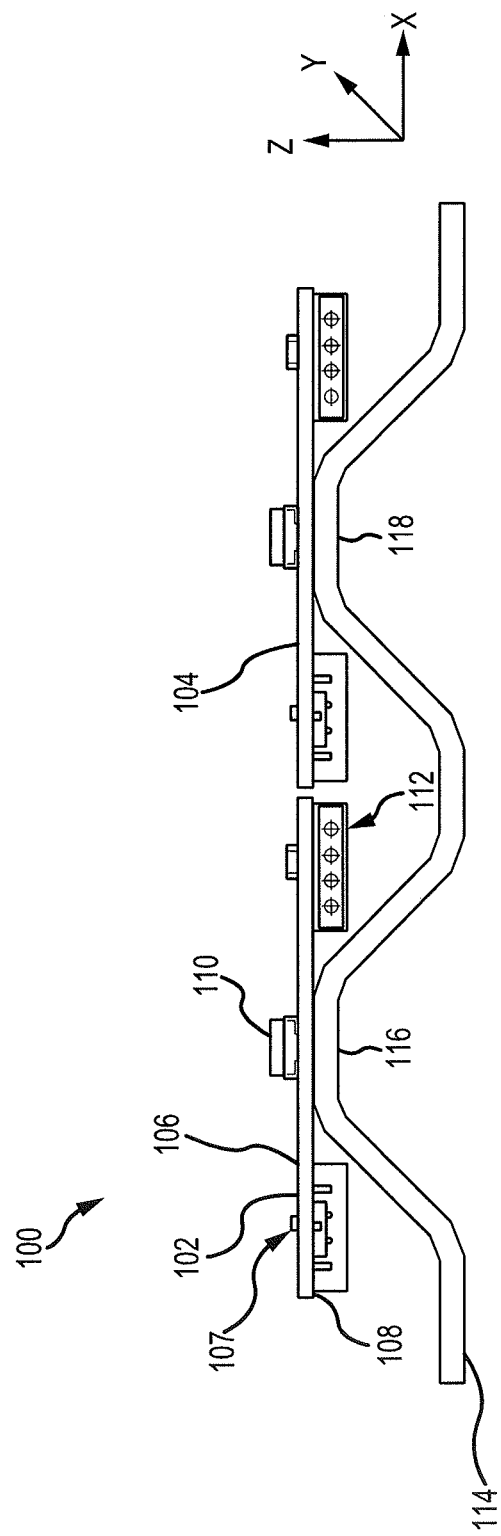
FIG. 1 illustrates a system for distributing heat from a printed circuit board (PCB) having a light emitting diode (LED), the system utilizing a corrugated heat sink, in accordance with various embodiments.

Referring now to FIG. 1, a system 100 for transferring heat from printed circuit boards (PCBs) is shown. An X-Y-Z axis is shown throughout the drawings to illustrate respective orientations of components. In various embodiments, the system 100 may be included on an aircraft, such as in a passenger compartment.

The system 100 includes multiple PCBs including a first PCB 102 and a second PCB 104. The PCB 102 includes a first side 106 and a second side 108. Various electrical and other components may be coupled to the PCB 102. In particular, the PCB 102 may include a light emitting diode (LED) 110 located on the first side 106, various electrical components 107 located on the first side 106, and various electrical components 112 located on the second side 108. The various electrical components may include any one or more of resistors, capacitors, inductors, microchips, controllers, or the like.

The system 100 may further include a corrugated heat sink 114. The corrugated heat sink 114 may include a thermally conductive material, such as metal. The corrugated heat sink 114 may include a plurality of ribs including a first rib 116 and a second rib 118. The first rib 116 may contact the first PCB 102, and the second rib 118 may contact the second PCB 104. The ribs 116, 118 may extend along a portion or all of the PCBs 102, 104 along the Y direction. Heat (i.e., thermal energy) from the PCB 102 may be transferred to the corrugated heat sink 114 via the first rib 116, and may be distributed into the environment by the corrugated heat sink 114.

Figure 2B:
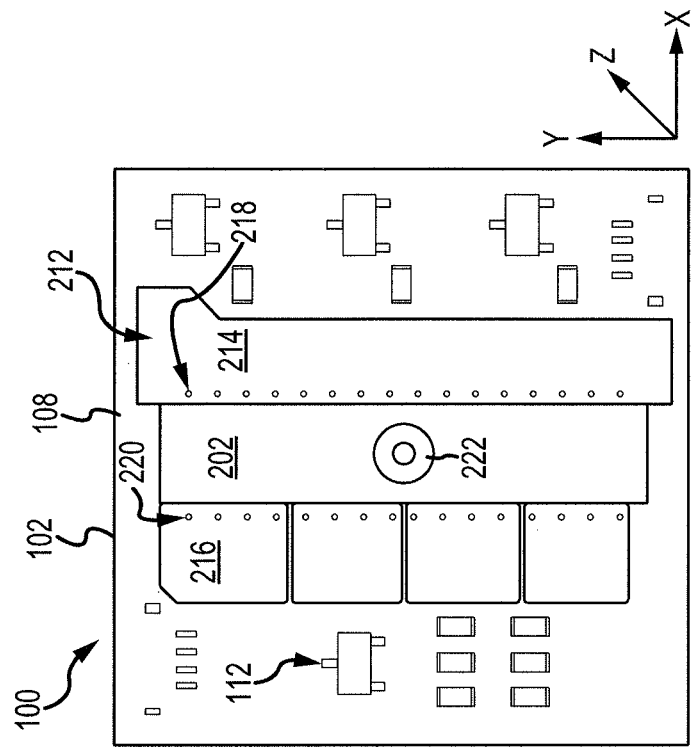
FIGS. 2A and 2B illustrate a first side and a second side, respectively, of a PCB of the system of FIG. 1, in accordance with various embodiments.
Figure 2A:
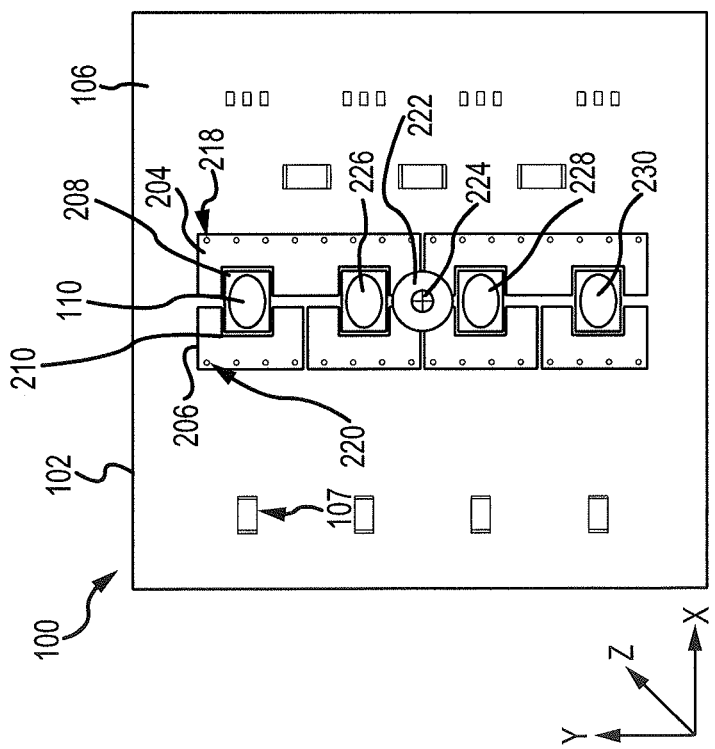

Referring now to FIGS. 2A and 2B, additional details of the system 100 are shown. FIG. 2A illustrates the first side 106 of the PCB 102 and FIG. 2B illustrates the second side 108 of the PCB 102. In particular, the first side 106 may include multiple LEDs coupled thereto. The multiple LEDs may include the LED 110, a second LED 226, a third LED 228, and a fourth LED 230. In various embodiments, the PCB 102 may include any quantity of LEDs oriented in any fashion.

The second side 108 of the PCB 102 may include a first metal strip 202. The first metal strip 202 may be elongated and may extend along the Y direction. With brief reference to FIGS. 1 and 2B, the first rib 116 may contact the first metal strip 202 and may receive and distribute heat from the first metal strip 202. In various embodiments, thermal paste, thermal tape, thermal pads, or other thermal materials may be located between the first rib 116 and the first metal strip 202 in order to facilitate the transfer of heat. However, the system 100 may still function as desired without such thermal materials.

Returning reference to FIGS. 2A and 2B, the first side 106 of the PCB 102 may include metal pads including a first metal pad 204 and a second metal pad 206. Where used in this context, "metal" may refer to any conductive metallic or non-metallic conductive material. The LED 110 may include a first terminal 208 and a second terminal 210. In various embodiments, the first terminal 208 or the second terminal 210 may be electrically connected to the anode of the LED 110 and the other of the first terminal 208 or the second terminal 210 may be electrically connected to the cathode of the LED 110. The first metal pad 204 may be electrically connected to the first terminal 208, and the second metal pad 206 may be electrically connected to the second terminal 210. In that regard, the first metal pad 204 may be electrically isolated from the second metal pad 206. The first metal pad 204 and the second metal pad 206 may receive heat from the LED 110.

The second side 108 of the PCB 102 may include second metal strips which may be split into a first portion 214 and a second portion 216. The first portion 214 and the second portion 216 may be electrically isolated from the first metal strip 202. Even with the electrical isolation, heat from the first portion 214 and the second portion 216 may be transferred to the first metal strip 202, from which it may be distributed to a heat sink (such as the heat sink 114).

The first portion 214 may be electrically connected to the first metal pad 204. For example, vias 218 may extend through the PCB 102 and may electrically connect the first portion 214 to the first metal pad 204. In various embodiments, the vias 218 may be filled with a conductor, such as copper. The second portion 216 may be electrically connected to the second metal pad 206. For example, vias 220 may extend through the PCB 102 and may electrically connect the second portion 216 to the second metal pad 206. In various embodiments, the vias 220 may be filled with a conductor, such as copper.

As heat is generated by the LED 110 (as well as the electrical components 107, 112), a portion of the heat may transfer through the PCB 102 and be received by the first metal strip 202. A portion of the heat may likewise transfer from the LED 110 to the first metal pad 204 and the second metal pad 206 by the proximity to the LED 110, and by the electrical connection between the pads 204, 206 and the terminals 208, 210. The heat received by the metal pads 204, 206 may be transferred to the first portion 214 and the second portion 216 by the vias 218, 220. The heat may then transfer from the first portion 214 and the second portion 216 to the first metal strip 202, where it may be received and distributed by a heat sink.

An aperture 222 (e.g., a countersink) may be formed through the PCB 102. In various embodiments, the aperture 222 may be formed in the center of the X-Y plane of the PCB. With brief reference to FIGS. 1, 2A, and 2B, a fastener 224 may extend through the aperture 222 and may fasten the PCB 102 to the corrugated heat sink 114.

As shown, the PCB 102 includes the LEDs 110, 226, 228, 230. In various embodiments, multiple first metal pads 204 may be included on the PCB 102. In various embodiments, one metal pad 204 may be used for each LED, one metal pad 204 may be used for two LEDs, one metal pad 204 may be used for the combination of all LEDs, or the like. Likewise, multiple second metal pads 206 may be included on the PCB 102. In various embodiments, one second metal pad 206 may be used for each LED, one second metal pad may be used for two LEDs, one second metal pad 206 may be used for the combination of all LEDs, or the like. The same may be true for the first portion 214 and the second portion 216 of the second metal strips 212. That is, the PCB 102 may include one or multiple first portions 214 and one or multiple second portions 216.

The system 100 may be implemented in or on an exterior of an aircraft to provide exterior lighting to the aircraft. For example, the PCB 102 may be installed on an exterior of a fuselage, wings, landing gear, blades, or the like of an aircraft. In that regard, the PCB 102 is designed to be coupled to a portion of an aircraft such as an exterior portion (e.g., a portion in contact with the environment of the aircraft).

The ability to place the electrical components 112 on the second side 208 of the PCB 102 allows for denser placement of components on the PCB 102. This desirably results in the entire system 100 being smaller than if components are only able to be placed on the first side 106. The corrugated heat sink 114 of FIG. 1 has a variable distance to the PCB 102 (e.g., the first rib 116 contacts the PCB 102 while the area between the first rib 116 and the second rib 118 fails to contact the PCB 102). This variable distance allows the placement of the electrical components 112 on the second side 108 (e.g., the electrical components 112 are located in an area with a greater distance between the corrugated heat sink 114 and the PCB 102).

Figure 3A:
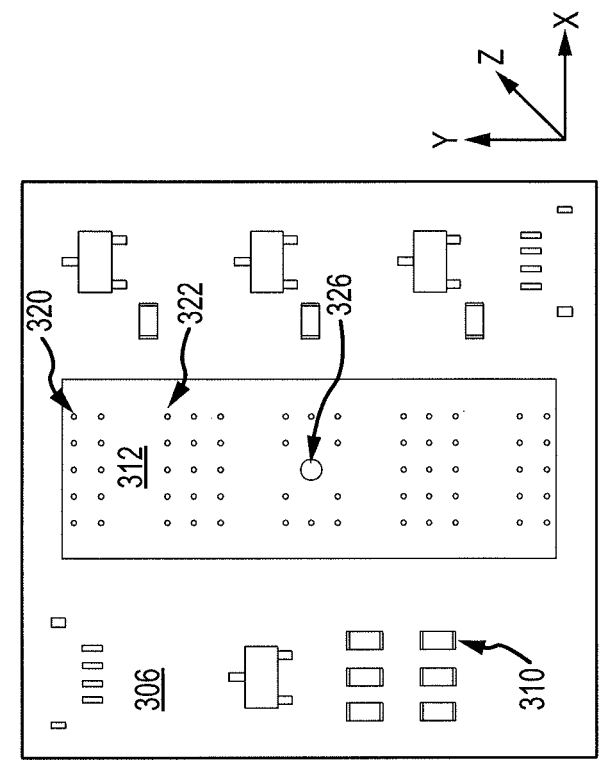
FIGS. 3A and 3B illustrate a first side and a second side, respectively, of a PCB of a system for distributing heat from a PCB having a LED, in accordance with various embodiments.
Figure 3B:
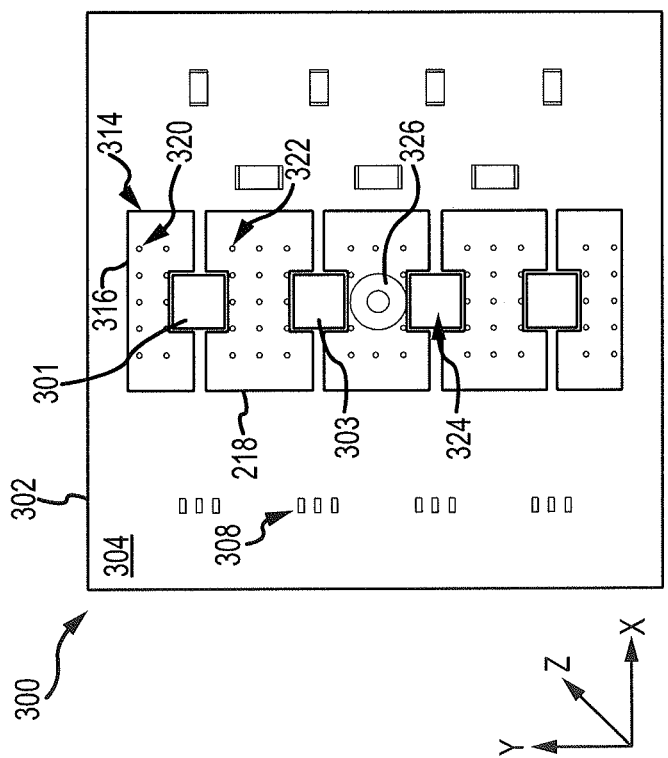

Turning now to FIGS. 3A and 3B, another system 300 for transferring heat from PCBs with LEDs is shown. The system 300 includes a PCB 302 having a first side 304 and a second side 306. A plurality of LEDs 324 including a first LED 301 are located on the first side 304. A plurality of electrical components 308 may be located on the first side 304, and a plurality of electrical components 310 may be located on the second side 306.

A metal strip 312 may be positioned on the second side 306. A plurality of metal pads 314 including a first metal pad 316 may be positioned on the first side 304. The metal pads 314 may be electrically isolated from the LEDs 324 and may include any quantity of metal pads. For example, the metal pads 314 may include a single metal pad that includes cutouts or openings for the LEDs 324. As another example, the metal pads 314 may include separate metal pads surrounding each of the LEDs 324. As another example, the metal pads 314 may include a single metal pad between each LED 324 and on the outer ends of the outer LEDs 324 (i.e., the first metal pad 316 on the outer end of the outer LED 301, and a second metal pad 318 between the LED 301 and an adjacent LED 303). The metal pads 314 may be shaped to partially or fully surround the LEDs 324 along the X-Y plane.

The metal pads 314 may be electrically connected to the metal strip 312. For example, a first plurality of vias 320 may electrically connect the first metal pad 316 to the metal strip 312, and a second plurality of vias 322 may electrically connect the second metal pad 318 to the metal strip 312. In various embodiments, the vias 320, 322 may be filled with a conductor, such as copper.

An aperture 326 may be formed through the PCB 302 and may be used in conjunction with a fastener to couple the PCB 302 to a heat sink (such as the corrugated heat sink 114 of FIG. 1).

Figure 4:
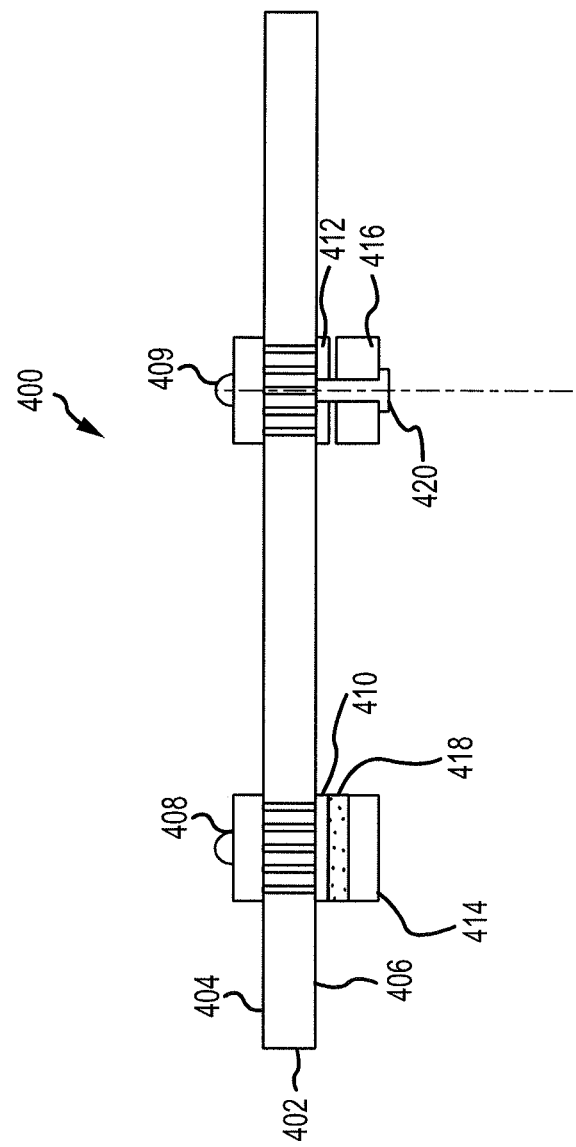
FIG. 4 illustrates a system for distributing heat from a PCB having a LED, the system utilizing conductive surface mounted components as heat sinks, in accordance with various embodiments.

Turning now to FIG. 4, another system 400 for transferring heat from PCBs is shown. The system 400 may be used in conjunction with the PCB 102 of FIGS. 2A and 2B, with the PCB 302 of FIGS. 3A and 3B, or with other PCBs. The system 400 may include a PCB 402 having a first side 404 and a second side 406. A first LED 408 and a second LED 409 may be located on the first side 404. A first metal strip 410 may be located on the second side 406 and designed to receive heat from the first LED 408, and a second metal strip 412 may also be located on the second side 406 and designed to receive heat from the second LED 409.

Rather than using a corrugated heat sink, the system 400 may include surface mounted heat sinks. In particular, a first conductive surface mounted heat sink 414 may be coupled to the second side 406 and in contact with the first metal strip 410, and a second conductive surface mounted heat sink 416 may be coupled to the second side 406 and in contact with the second metal strip 412. The conductive surface mounted heat sink 414, 416 may be coupled to the PCB 402 in any known manner. For example, the first conductive surface mounted heat sink 414 may be coupled to the first metal strip 410 using a thermal adhesive (e.g., a two-part epoxy resin or cyanoacrylate). As another example, the second conductive surface mounted heat sink 416 may be coupled to the second metal strip 412 using a fastener 420.

Benefits and other advantages have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, and any elements that may cause any benefit or advantage to occur or become more pronounced are not to be construed as critical, required, or essential features or elements of the disclosure. The scope of the disclosure is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C.

Systems, methods and apparatus are provided herein. In the detailed description herein, references to "various embodiments", "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

Furthermore, no element, component, or method step in the present disclosure is intended to be dedicated to the public regardless of whether the element, component, or method step is explicitly recited in the claims. No claim element herein is to be construed under the provisions of 35 U.S.C. 112(f), unless the element is expressly recited using the phrase "means for." As used herein, the terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A system for transferring heat from printed circuit boards (PCBs) with light emitting diodes (LEDs), the system comprising:
   a PCB having a first side and a second side and configured to be coupled to an exterior portion of an aircraft;
   a LED located on the first side of the PCB;
   a first metal strip located on the second side of the PCB;
   a metal pad located on the first side of the PCB;
   a second metal strip located on the second side of the PCB and electrically connected to the metal pad located on the first side of the PCB; and
   a heat sink configured to contact the first metal strip to dissipate heat from the PCB.

2. The system of claim 1, wherein the second metal strip is electrically connected to the metal pad via metal-filled vias, and the second metal strip is electrically isolated from the first metal strip.

3. The system of claim 1, wherein:
   the LED has a first terminal and a second terminal;
   the metal pad includes a first metal pad electrically connected to the first terminal of the LED and a second metal pad electrically connected to the second terminal of the LED; and
   the second metal strip includes a first portion electrically connected to the first metal pad and a second portion electrically connected to the second metal pad.

4. The system of claim 1, wherein the metal pad is electrically isolated from the LED and is electrically connected to the first metal strip.

5. The system of claim 1, further comprising an aperture extending through the PCB and the first metal strip and configured to receive a fastener to couple the PCB to the heat sink.

6. The system of claim 1, wherein the heat sink includes a corrugated heat sink separate from the PCB and having a first rib configured to contact and extend along the first metal strip to dissipate heat from the PCB.

7. The system of claim 1, wherein the heat sink includes a conductive surface mounted component configured to be mounted to the PCB.

8. The system of claim 1, further comprising electrical components coupled to the second side of the PCB.

9. A system for transferring heat from printed circuit boards (PCBs) with light emitting diodes (LEDs), the system comprising:
   a PCB having a first side and a second side and configured to be coupled to an exterior portion of an aircraft;
   a LED located on the first side of the PCB;
   a first metal strip located on the second side of the PCB;
   a metal pad located on the first side of the PCB, electrically isolated from the LED, and electrically connected to the first metal strip; and
   a corrugated heat sink separate from the PCB and having a first rib configured to contact and extend along the first metal strip to dissipate heat from the PCB.

10. The system of claim 9, further comprising a second metal strip located on the second side of the PCB and electrically connected to the metal pad located on the first side of the PCB.

11. The system of claim 10, wherein the second metal strip is electrically connected to the metal pad via metal-filled vias, and the second metal strip is electrically isolated from the first metal strip.

12. The system of claim 10, wherein:
   the LED has a first terminal and a second terminal;
   the metal pad includes a first metal pad electrically connected to the first terminal of the LED and a second metal pad electrically connected to the second terminal of the LED; and
   the second metal strip includes a first portion electrically connected to the first metal pad and a second portion electrically connected to the second metal pad.

13. The system of claim 9, further comprising an aperture extending through the PCB and the first metal strip and configured to receive a fastener to couple the PCB to the corrugated heat sink.

14. A system for transferring heat from printed circuit boards (PCBs) with light emitting diodes (LEDs), the system comprising:

a PCB having a first side and a second side and configured to be coupled to an exterior portion of an aircraft;

a LED located on the first side of the PCB;

a first metal strip located on the second side of the PCB;

a metal pad located on the first side of the PCB;

a second metal strip located on the second side of the PCB and electrically connected to the metal pad located on the first side of the PCB; and a conductive surface mounted component configured to be mounted to the second side of the PCB, to be in contact with the first metal strip, and to dissipate heat from the PCB.

15. The system of claim 14, wherein the second metal strip is electrically connected to the metal pad via metal-filled vias, and the second metal strip is electrically isolated from the first metal strip.

16. The system of claim 14, wherein:

the LED has a first terminal and a second terminal;

the metal pad includes a first metal pad electrically connected to the first terminal of the LED and a second metal pad electrically connected to the second terminal of the LED; and the second metal strip includes a first portion electrically connected to the first metal pad and a second portion electrically connected to the second metal pad.

17. The system of claim 14, wherein the metal pad is electrically isolated from the LED and is electrically connected to the first metal strip.

* * * * *